United States Patent [19]
Mastromatteo et al.

[11] Patent Number: 6,110,825
[45] Date of Patent: Aug. 29, 2000

[54] PROCESS FOR FORMING FRONT-BACK THROUGH CONTACTS IN MICRO-INTEGRATED ELECTRONIC DEVICES

[75] Inventors: Ubaldo Mastromatteo, Cornaredo; Bruno Murari, Monza, both of Italy

[73] Assignee: STMicroelectronics, S.r.l., Agrate Brianza, Italy

[21] Appl. No.: 09/200,496

[22] Filed: Nov. 25, 1998

[30] Foreign Application Priority Data

Nov. 26, 1997 [EP] European Pat. Off. .............. 97830626

[51] Int. Cl.$^7$ ............................. H01K 3/10; H01L 21/70
[52] U.S. Cl. .......................... 438/667; 438/53; 438/666; 438/667
[58] Field of Search ............................ 438/52, 53, 666, 438/667

[56] References Cited

U.S. PATENT DOCUMENTS

| | | | |
|---|---|---|---|
| 5,322,816 | 6/1994 | Pinter | 437/203 |
| 5,405,805 | 4/1995 | Homma | 437/195 |
| 5,496,755 | 3/1996 | Bayraktaroglu | 437/51 |

FOREIGN PATENT DOCUMENTS 0 363 256 A1   4/1990   European Pat. Off. .

OTHER PUBLICATIONS

Guldan et al., "Method for Producing Via–Connections in Semiconductor Wafers Using a Combination of Plasma and Chemical Etching," in *IEEE Transactions on Electron Devices*, ED–30(10):1402–1403, 1983.

Linder et al., "Fabrication Technology for Wafer Through--Hole Interconnections and Three–Dimensional Stacks of Chips and Wafers," *IEEE*, pp. 349, 1994.

*Primary Examiner*—Charles Bowers
*Assistant Examiner*—Lisa Kilday
*Attorney, Agent, or Firm*—Theodore E. Galanthay; Robert Iannucci; Seed Ip Law Group PLLC

[57] ABSTRACT

The process comprises the steps of: forming a through hole from the back of a semiconductor material body; forming a hole insulating layer of electrically isolating material laterally covering the walls of the through hole; forming a through contact region of conductive material laterally covering the hole insulating layer inside the hole and having at least one portion extending on top of the lower surface of the body; forming a protective layer covering the through contact region; and forming a connection structure extending on top of the upper surface of the body between and in electrical contact with the through contact region and the electronic component.

19 Claims, 2 Drawing Sheets

PROCESS FOR FORMING FRONT-BACK THROUGH CONTACTS IN MICRO-INTEGRATED ELECTRONIC DEVICES

TECHNICAL FIELD

The invention relates to a process for forming front-back through contacts in micro-integrated electronic devices.

BACKGROUND OF THE INVENTION

As known, contacting of micro-integrated electronic devices requires contact pads to be formed on the front of a wafer integrating components forming the electronic devices and connected to external connection pins through bonding wires.

It is also known that the continuous reduction of the dimensions and the corresponding increase in the components, which can be integrated in one and the same chip, involves an increase in the number of pins and the corresponding contact pads required for the external connection of the chip.

Consequently, the space required for the interconnections becomes an increasingly large fraction of the chip area. To avoid this problem, the actual dimensions of the bonding pads and the space between them would have to reduce; there are, however, limiting factors (minimum dimensions of the bonding wire; mechanical alignment tolerances of the wires on the pads) which cause the minimum dimensions areas of the pads to be of some tens of microns. These dimensions are particularly large if compared to the minimum lithographic dimensions, of the order of tenths of a micron.

It is therefore desirable to be able to arrange the pads also in different areas of the device such as on the back; on the other hand this is not easy to achieve because of the need to isolate the connections from the conductive regions of the device; to produce reliable electrical connections between the front of the device, on which the electrical connection metal lines run, and the back, on which the pads would be arranged; and to use steps compatible with the conventional standard process steps.

The arrangement of the contact pads on the back of the chip is also desirable in cases, such as in inkjet print heads, wherein it is necessary to have an upper surface which is completely planar and free from regions which are even partially projecting (due to the bonding regions), for example to permit frequent cleaning of the upper surface.

SUMMARY OF THE INVENTION

An object of the invention is therefore to provide a process which enables the contact pads to be arranged on the back of the wafer.

The invention provides a process for forming front-back through contacts in micro-integrated electronic devices. In one embodiment of the invention, the invention provides a process for forming a front-back through contact in a micro-integrated electronic device having an electronic component integrated in a semiconductor material body including an upper and a lower surface, the process comprising forming a through hole in the body, forming a hole insulating layer of electrically isolating material covering lateral walls of the through hole, forming a through contact region of conductive material over the hole insulating layer and having at least one portion extending on top of the lower surface of the body, forming a protective layer over the contact region and over the lower surface of the body, and forming a connection structure extending on top of the upper surface of the body and in contact with the through contact region and the electronic component.

BRIEF DESCRIPTION OF THE DRAWINGS

For an understanding of the invention a preferred embodiment will now be described, purely by way of non-exhaustive example, with reference to the accompanying drawings.

DETAILED DESCRIPTION OF THE INVENTION

A production process with two metal levels will be described as an example below even though the invention is also applicable to processes with a different number of metal levels (one, three, etc.).

Figure 1:
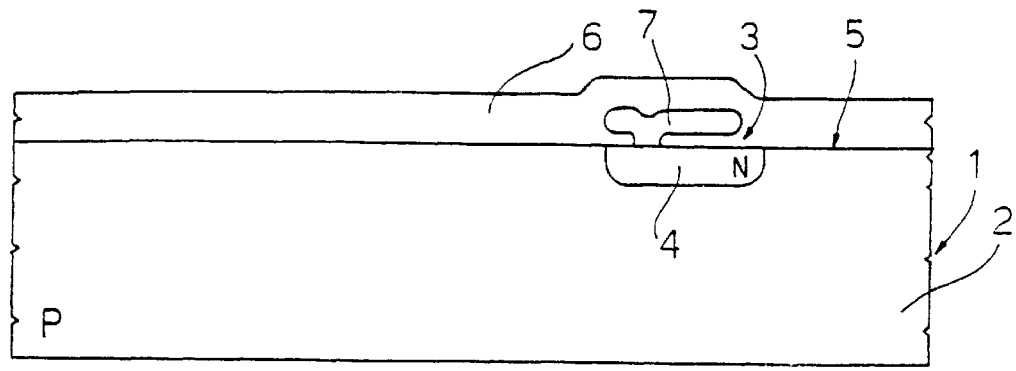
FIGS. 1–8 show cross-sections through a semiconductor material wafer in successive production steps according to the present process.

In FIG. 1, a semiconductor material (silicon) wafer 1 has been subjected to known production steps for forming micro-electronic components; in particular, in the example shown, in a substrate 2 of a first conductivity type, for example P-type, a component 3 including a well 4 of a second conductivity type, e.g., N-type in this case, has been formed; a hole insulating layer 6 (typically formed by two superimposed layers) has been grown or deposited on the surface 5 of the substrate; inside this layer, contact electrodes 7 of metal material have been formed, starting from a first metal level or layer, for connecting at least some of the various components forming the micro-integrated electronic device through connection lines (not shown).

Figure 2:
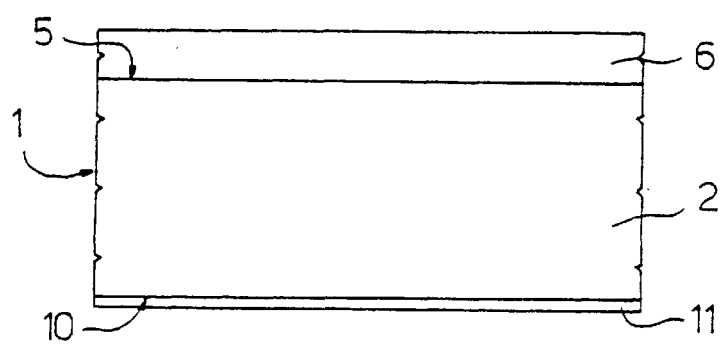

A cleaning etching step of the back surface 10 follows, and then a scree layer 11 is deposited, for shielding the wafer 1 during a laser beam drilling step for forming through contacts. In particular, a metal material capable of reflecting the laser light is used for this purpose; chromium may be used, for example. The intermediate structure of FIG. 2 is thus obtained.

Figure 3:
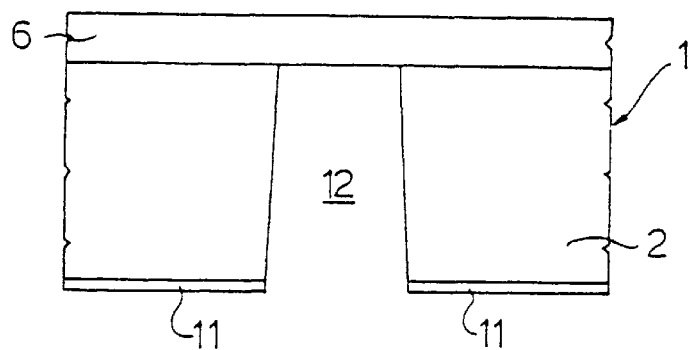

A back masking step (and optionally also a front masking step, should this be necessary) is then carried out, and the metal material of the shielding layer 11 is removed from zones where holes of the through contacts are to be formed. The wafer 1 is then drilled from the back by means of a laser beam. In particular, the laser beam causes evaporation of silicon of the substrate 2 from zones not covered by the shielding layer 11, stopping at the hole insulating layer 6 which does not absorb laser radiation; on the matter, it is essential to avoid metal regions to extend over the wafer upper surface 5 at the drilling zone, to prevent drilling energy from being transmitted to the metal regions and thus preventing damage to them. In this step, any misalignments between the laser beam and the zones of the wafer 1 not covered by the shielding layer 11 do not damage the wafer 1, thanks to the reflecting properties of the shielding layer 11. The intermediate structure of FIG. 3, in which the hole obtained in this phase is denoted by 12, is thus obtained.

The shielding layer 11 is then removed and a hole insulating layer 15, preferably of oxide, is formed. The hole insulating layer 15 is preferably obtained by depositing a conform silicon oxide layer (e.g., LPCVD—Low Pressure Chemical Vapour Deposition—at low temperature, below 400° C.) which exactly follows the profile of the structure underneath; this deposition may be carried out, for example, in an ozone atmosphere using an AMT P5000 machine so as to grow an oxide layer at least 1 μm thick. If it is desired to use thermal oxidation for insulating the holes, it would be necessary to proceed with this oxidation before opening the contacts on the front of the wafer and depositing the first metal layer. In both cases, the hole insulating layer 15 completely covers the lateral wall of the hole 12 and the rear surface 10 of the wafer 1. A conductive layer 16, intended to form the through contacts, is then formed on top of the hole insulating layer 15; in particular, the conductive layer 16 is of metal and may be obtained by two different metal layers, such as a first metal layer deposited by CVD (Chemical Vapour Deposition), for promoting adhesion and uniform covering of the wall of the hole 12, and a second metal layer grown by electroplating, so as to obtain rapid growth. In particular, the CVD deposited metal may be aluminium, copper, tungsten or titanium, and the layer grown by electroplating may be copper. Alternatively the second metal layer may be electroless gold-plated nickel (Ni/Au).

Figure 4:
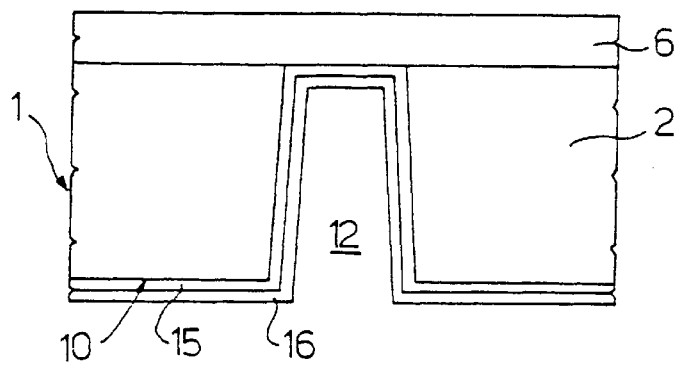

The structure of FIG. 4 is obtained at the end of the step of forming the conductive layer 16.

Figure 5:
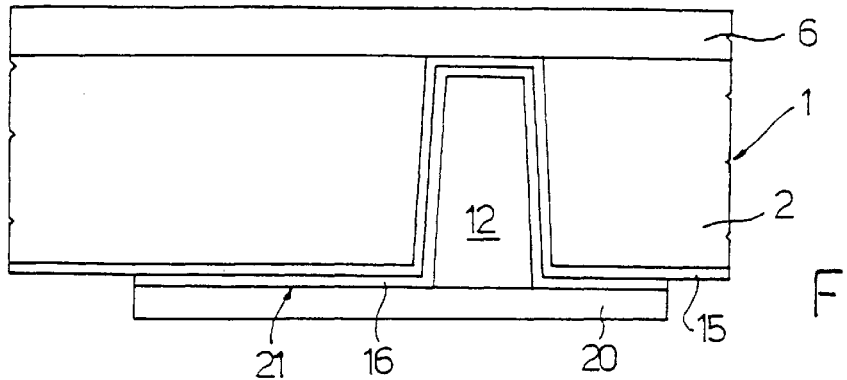

A mask is then deposited for forming the rear pads; this mask, denoted by 20 in FIG. 5, is formed with a photosensitive stick foil or with non-liquid adhesive material which adheres to the back surface of wafer 1 and can be defined by conventional photolithographic techniques, analogously to photoresist, to form mask 20 with the desired shape; being non-liquid, it covers hole 12 without penetrating it. Mask 20 covers portions of the conductive layer 16 where contact pads (zone 21) and the hole 12 are to be formed; subsequent etching of the metal layer 16 where uncovered thus permits metal to be removed where it is of no use, providing the intermediate structure of FIG. 5.

Figure 6:
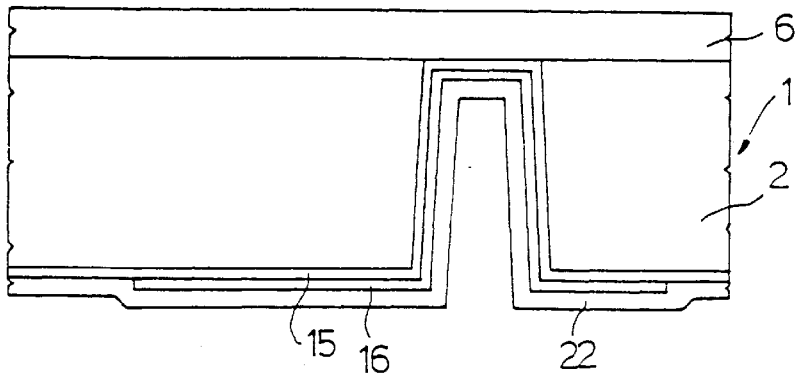
Figure 7:
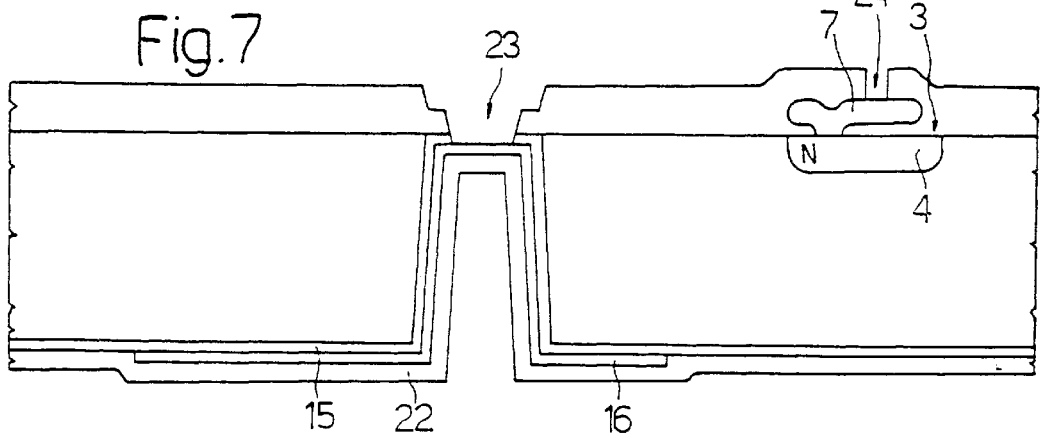

After removal of mask 20, a protective back layer 22 is deposited (such as a nitride or BPSG—Boron Phosphorous Silicon Glass—layer with a thickness of approximately 2 μm) which covers the entire rear surface, as shown in FIG. 6. Steps are then carried out for opening the paths from the front, preferably using a double mask to form a gentle step. In particular, a first mask (not shown) is deposited which covers the entire upper surface and has openings at the holes 12; using this mask, part of the thickness of the hole insulating layer 6 is removed, half for example; a second mask (not shown) is then deposited, having openings at the holes 12 but of a diameter smaller than the first mask; the remaining thickness of the hole insulating layer 6 and the portion of the hole insulating layer 15 on the bottom of the hole 12 are then removed. The two removal steps are preferably carried out by wet etching. After removal of the two masks the structure of FIG. 7 is obtained, wherein the double mask step of the via 23 formed in the hole insulating layer 6 is clearly visible. In this situation, the conductive layer 16 has been rendered accessible from the front. Furthermore, in this double mask step, parts of the hole insulating layer 6 where the connections to the first metal layer are to be formed are removed, in the present example an opening 24 is formed over part of the contact electrode 7, using the first mask only for example.

Figure 8:
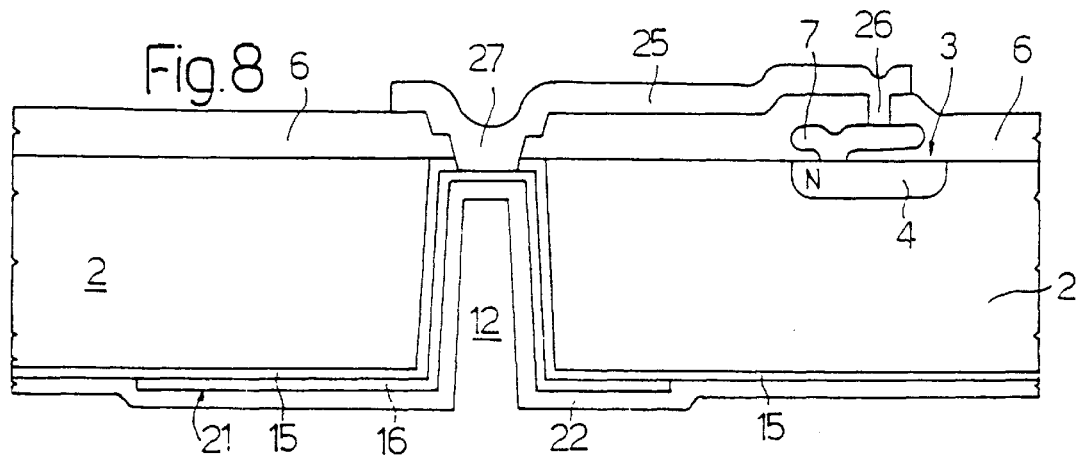

The steps for forming the device last metal layer, a second metal level in the case shown, follow; in detail, a metal layer 25 is deposited which fill the opening 24 (portion 26) and the via 23 (portion 27) and permits direct electrical connection between the electrode 7 and the pad zone 21 of the conductive layer 16. The structure of FIG. 8 is thus obtained after shaping the metal layer 25.

The usual device finishing steps follow; these are not shown but include covering the front with a passivation layer, masking back and front to remove the protective layers from the pad zones (back zone 21 in the example shown); forming bumps at the pad zones, etc.

The advantages of the described method are as follows. Firstly, it enables pads to be formed on the back of the device, requiring on the front only a zone of reduced dimensions where the vias 23 and the portions 27 are to be formed. Furthermore, it does not require modification of the known device manufacturing steps, but only adding the steps of drilling and forming the through metal lines. Forming the contact when the components are finished ensures that the components will not be damaged; forming the hole coating insulating layer further ensures electrical isolation between the through contact and the conductive regions of the device.

Finally, it will be clear that numerous modifications and variants may be introduced to the described and illustrated method, all of which come within the scope of the invention as defined in the accompanying claims. In particular, the method may also be applied, as stated, to processes with a single metal level, which should then be deposited after the hole 12 has been formed; or to processes with several metal levels, wherein drilling may take place before depositing the last metal level at the latest.

What is claimed is:

1. A process for forming front-back through contacts in micro-integrated electronic devices having an integrated electronic component in a body of semiconductor material having a front with an upper surface and a back with a lower surface, said process comprising the steps of:

forming a through hole in said body;

forming a hole insulating layer of electrically isolating material, covering laterally walls of said through hole;

forming a through contact region of conductive material laterally covering said hole insulating layer and having at least one portion extending on top of said lower surface of said body;

forming a protective layer of said hole; and forming a connection structure extending on top of said upper surface of said body between and in electrical contact with said through contact region and said electronic component.

2. The process according to claim 1 wherein said step of forming a through hole is carried out from the back.

3. The process according to claim 2 wherein said step of forming a through hole comprises the step of lasing said body by a laser beam and in that the step of forming a protective metal shield on the lower surface of said body is carried out before said step of forming a through hole.

4. The process according to claim 1 wherein said step of forming a hole insulating layer comprises the step of forming a silicon oxide layer.

5. The process according to claim 4 wherein said step of forming a silicon oxide layer comprises the step of depositing a conform CVD oxide layer.

6. The process according to claim 4 wherein said step of forming a silicon oxide layer comprises the step of growing an oxide layer from ozone.

7. The process according to claim 1 wherein said step of forming a through contact region comprises the step of depositing a metal contact layer on the back.

8. The process according to claim 7 wherein the material of said through contact region is selected from aluminium, copper, tungsten, and titanium and in that said step of depositing a metal contact layer is carried out by CVD.

9. The process according to claim 7 wherein said step of depositing a metal contact layer is followed by a step of metal material growth by electroplating.

10. The process according to claim 7 wherein a step of shaping said metal contact layer to form rear contact pads is carried out after said step of depositing a metal contact layer.

11. The process according to claim 1 wherein said step of forming a protective layer comprises the step of depositing a passivation layer laterally covering said through contact region and said lower surface of said body.

12. The process according to claim 11 wherein said protective layer is selected from silicon nitride, oxynitride, silicon glass or polyimide.

13. The process according to claim 12 wherein said step of forming a connection structure comprises the steps of:

forming openings in an insulating layer covering said upper surface of said body, at least a first of said openings being aligned with said hole and uncovering a part of said through contact region and a second of said openings being aligned with a conductive region of said electronic component; and forming an electrical metal connection line extending between said first and said second opening and electrically connecting said through contact region and said conductive region.

14. The process according to claim 13 wherein said process comprises a single upper metal layer and in that said step of forming an electrical connection line comprises the step of depositing a single metal layer on said insulating layer and shaping said single metal layer to form contact electrodes for said electronic component and said connection structure.

15. The process according to claim 13 wherein said process comprises at least one lower metal level and an upper metal level on said body upper surface; in that, before said step of forming a through hole, the step is carried out of shaping a first metal layer to form, inside said insulating layer, contact electrodes for said electronic component and in that said step of forming a connection structure comprises the steps of depositing a second metal layer on said insulating layer and shaping said second metal layer.

16. A method for manufacturing an electronic device having an electronic component integrated in a semiconductor material body including an upper and a lower surface, said method comprising:

forming a through hole in the body;

forming a hole insulating layer of electrically isolating material covering laterally walls of the through hole;

forming a through contact region of conductive material over the hole insulating layer and having at least one portion extending on top of the lower surface of the body;

forming a protective layer over the contact region and over the lower surface of the body; and forming a connection structure extending on top of the upper surface of the body and in contact with the through contact region and the electronic component.

17. The method of claim 16 wherein said step of forming a through hole comprises:

forming a patterned protective shield layer to mask the lower surface of the body; and removing an unmasked portion of the body from the lower surface to form the through hole.

18. The method of claim 17 wherein said step of removing the unmasked body portion is accomplished by using a laser beam.

19. The method of claim 16 wherein said step of forming a connection structure comprises:

forming a plurality of openings in an insulating layer covering the upper surface of the body, at lest a first opening being aligned with the through hole and uncovering a portion of the contact region, and a second opening being aligned with a conductive region of the electronic component; and forming an electrically conductive line extending between the first and second openings and electrically connecting the contact region and the conductive region.

* * * * *